(12) United States Patent
Harbers et al.

(10) Patent No.: US 7,682,850 B2
(45) Date of Patent: Mar. 23, 2010

(54) WHITE LED FOR BACKLIGHT WITH PHOSPHOR PLATES

(75) Inventors: Gerard Harbers, Sunnyvale, CA (US); Serge Bierhuizen, Milpitas, CA (US); Mark Pugh, Los Gatos, CA (US)

(73) Assignee: Philips Lumileds Lighting Company, LLC, San Jose, CA (US)

( * ) Notice: Subject to any disclaimer, the term of this patent is extended or adjusted under 35 U.S.C. 154(b) by 841 days.

(21) Appl. No.: 11/378,812

(22) Filed: Mar. 17, 2006

(65) Prior Publication Data

US 2007/0215890 A1    Sep. 20, 2007

(51) Int. Cl.
*H01L 21/00* (2006.01)

(52) U.S. Cl. .............. 438/25; 438/26; 438/29; 257/98

(58) Field of Classification Search .......... 257/98; 439/22, 25, 26, 27, 29
See application file for complete search history.

(56) References Cited

U.S. PATENT DOCUMENTS

| 6,809,781 | B2 | 10/2004 | Setlur et al. |
| 6,930,737 | B2 | 8/2005 | Weindorf et al. |
| 2003/0164914 | A1* | 9/2003 | Weber et al. ............... 349/115 |
| 2004/0065886 | A1* | 4/2004 | Eliashevich et al. ........... 257/79 |
| 2004/0262623 | A1 | 12/2004 | You |
| 2005/0184638 | A1 | 8/2005 | Mueller et al. |
| 2005/0269582 | A1 | 12/2005 | Mueller et al. |

FOREIGN PATENT DOCUMENTS

| DE | 10349038 A1 | 5/2004 |
| EP | 1256835 A2 | 11/2002 |
| EP | 1521235 A2 | 4/2005 |
| EP | 1605526 A2 | 5/2005 |
| WO | 2004032235 A2 | 4/2004 |
| WO | 2007060573 A1 | 5/2007 |

* cited by examiner

*Primary Examiner*—Kenneth A Parker
*Assistant Examiner*—Anthony Ho

(57) ABSTRACT

A white light LED for use in backlighting or otherwise illuminating an LCD is described where the white light LED comprises a blue LED over which is affixed a preformed red phosphor platelet and a preformed green phosphor platelet. In one embodiment, to form a platelet, a controlled amount of phosphor powder is placed in a mold and heated under pressure to sinter the grains together. The platelet can be made very smooth on all surfaces. A UV LED may also be used in conjunction with red, green, and blue phosphor plates. The LED dies vary in color and brightness and are binned in accordance with their light output characteristics. Phosphor plates with different characteristics are matched to the binned LEDs to create white light LEDs with a consistent white point for use in backlights for liquid crystal displays.

18 Claims, 5 Drawing Sheets

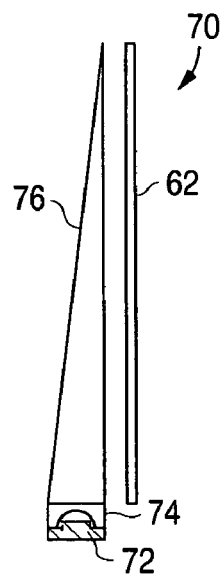
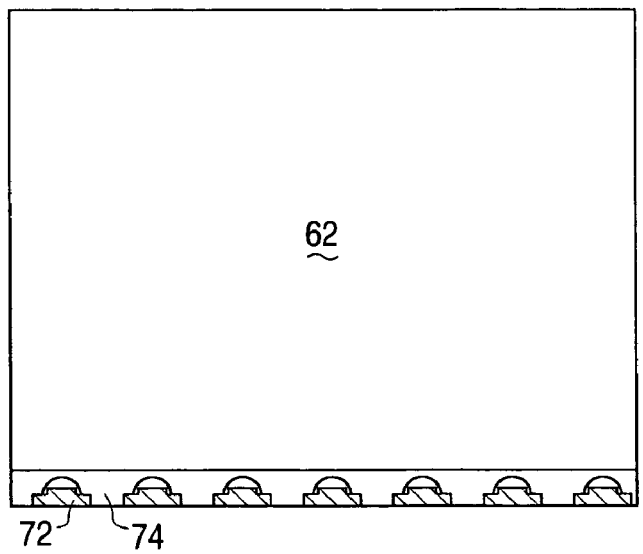
FIG. 9A  FIG. 9B
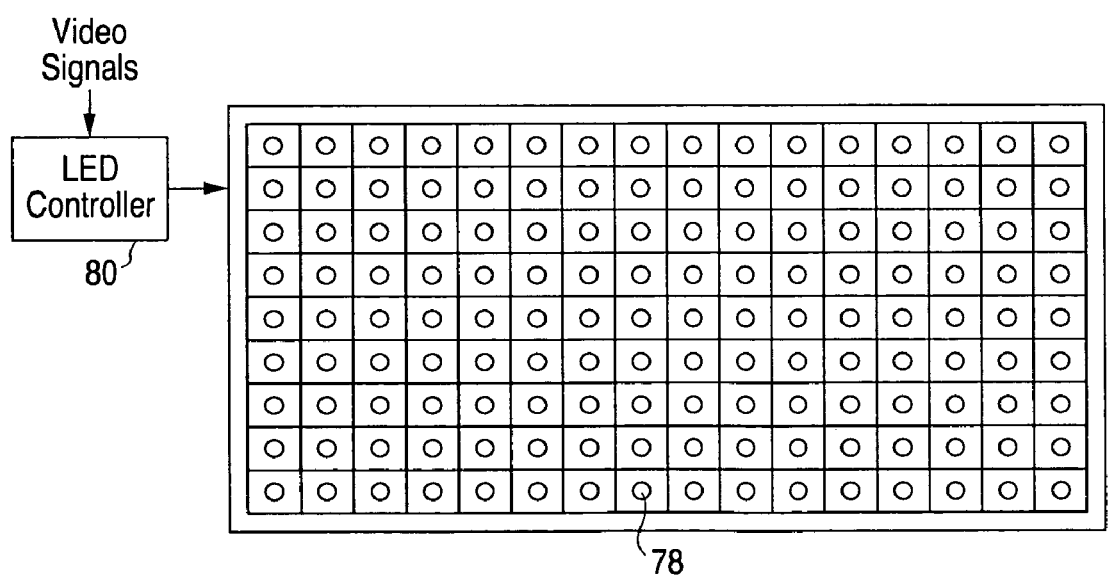
FIG. 10

WHITE LED FOR BACKLIGHT WITH PHOSPHOR PLATES

FIELD OF INVENTION

This invention relates to illumination devices using light emitting diodes (LEDs) and, in particular, to techniques for forming a white light LED for backlighting or otherwise illuminating a liquid crystal display (LCD).

BACKGROUND

Liquid crystal displays (LCDs) are commonly used in cell phones, personal digital assistants, laptop computers, desktop monitors, and televisions. One embodiment of the present invention deals with a color, transmissive LCD that requires white light backlighting.

FIG. 1 is a cross-sectional view of a prior art color, transmissive LCD 10 that includes a backlight 12 using LEDs. The backlight contains an array of red, green, and blue LEDs 14 whose combined light forms white light.

The backlight 12 ideally provides homogenous light to the back surface of the display. The backlight box has reflective bottom and side walls to mix the red, green, and blue light. The inner surfaces may be painted white. Mixing optics 16, such as a diffuser, improves the color mixing.

Above the mixing optics 16 are conventional LCD layers 18, typically consisting of a first polarizer, a thin film transistor array layer, a liquid crystal layer, a ground plane layer, a second polarizer, and RGB filters. Each red, green, and blue subpixel on the LCD screen is formed by the white light transmitted through the second polarizer in that subpixel area being filtered by a corresponding red, green, or blue filter portion. A single pixel of an image is formed by a set of red, green, and blue subpixels. The electric fields created at each subpixel location, by selectively energizing the thin film transistors at each subpixel location, causes the liquid crystal layer to change the polarization of the white light at each subpixel location. By controlling the thin film transistors, the magnitude of white light being filtered at each red, green, and blue subpixel is controlled to create an image on the LCD screen. LCDs are well known and need not be further described.

Using red, green, and blue components for the white light is particularly advantageous in a backlight because the RGB emission wavelengths correspond well to the spectral distributions of the RGB color filters.

The problem with the above backlight is that, since the red, green, and blue LEDs are separated, it is very difficult to obtain color uniformity across the backlight. Deep backlight boxes can be used to improve color mixing and/or special lenses on the LEDs may be used; however, such solutions become expensive and add to the size of the LCD.

White light LEDs are known and can be used in a backlight box. With ideal white light LEDs, there is only the need for brightness uniformity across the LCD screen, which is relatively simple to achieve.

One type of white light LED uses a blue LED with a YAG phosphor coating the LED. The YAG phosphor primarily emits yellow-green light when energized with the blue LED. The YAG phosphor emits a broad range of wavelengths including some red. Some of the blue light is transmitted through the YAG phosphor and combines with the yellow-green light to create white light. The YAG phosphor powder may be mixed in a liquid binder and deposited on the blue LED. The binder is then cured. One problem with such a white light LED is that the blue and yellow-green color components do not match well with the RGB filters in an LCD, resulting in low color gamut and low light transmission out of the LCD. For example, the red component of the white light is low compared to the green and blue components. Another problem with this type of white light LED is that the thickness and density of the YAG phosphor varies across the surface of the blue LED, resulting in nonuniform color.

Another problem with white light LEDs, is that the blue LEDs have variations in wavelength and brightness due to production tolerances. As a result, the color points of white light LEDs vary even when the phosphor coating is perfectly even.

It is known to affix a YAG phosphor plate over a blue LED die. However, due to the variations in the spectral distribution of the blue LED, the white color point varies. Hence, any backlight incorporating the white light LEDs will not have color uniformity across the screen.

It is also known to deposit red and green phosphors over a blue LED, where the blue light leaks through the phosphors to create white light. However, it is very difficult to control the magnitudes of the RGB emission components. The red and green phosphors coating the blue LED may vary in thickness and density across the blue LED, and may vary in thickness and density from one LED to another, resulting in color nonuniformity. The red and green phosphors may be deposited in a liquid binder, then cured, or deposited using other techniques such as electrophoresis.

What is needed is a white light LED that provides RGB components with a highly repeatable color point and which emits a uniform white light.

SUMMARY

Various techniques are described herein for creating a white light LED for backlighting an LCD. In one embodiment, the white light LED comprises a blue LED over which is affixed a preformed red phosphor platelet and a preformed green phosphor platelet. By preforming the red and green phosphor layers, the thickness, chemical composition, and density across each platelet can be very precisely controlled, and the wavelength conversion characteristics of the platelets can be tested prior to being affixed to an LED. The thickness of each platelet will typically be between 50-300 microns. In one embodiment, to form a platelet, a controlled amount of phosphor powder is placed in a mold and heated under pressure to sinter the grains together. The platelet can be made very smooth on all surfaces. A transparent binder material may also be used to control the density of the phosphor.

The platelets may be formed as a large sheet and then separated by sawing or breaking. All the resulting platelets will then be the same.

The platelets may be affixed to the LED and each other using silicone, low-melting-point glass, transparent adhesives, or held in place by a lens or other mechanical holder.

In another embodiment, the red and green phosphors are mixed together, with or without a binder, then heated under pressure to form a single platelet which is then affixed over the blue LED.

Red/green platelets may be formed having a variety of characteristics. Blue LEDs are tested for color and brightness and then binned in accordance with their light output characteristics. The red/green platelets are matched to each bin of blue LEDs so that the combination of the LED and platelet produces a consistent predetermined white point (RGB balance). For white light LEDs used in LCD backlights, the resulting red, green, and blue components outputted by the LCD through the RGB filters are tuned by the proper selection of phosphors characteristics to meet a predetermined white point.

In another embodiment, a red phosphor platelet is combined with a YAG phosphor to convert blue LED light into a warmer white light having a better RGB balance.

Instead of a blue LED, a UV LED may be used, and red, green, and blue phosphor platelets are affixed to the LED.

By proper selection of the phosphors, the resulting white light LEDs have ideal RGB components for use in an LCD to achieve high color gamut, high transmission by the LCD, and consistent white points. The requirement for color mixing in a backlight is totally or substantially eliminated. The white light LEDs may also be used for projection displays where LC layers and color filters modulate the projected light.

BRIEF DESCRIPTION OF THE DRAWINGS

FIGS. 9A and 9B illustrate another embodiment of an LCD with a linear array of white light LEDs in a narrow backlight box and an angled reflector for illuminating the LCD layers.

FIG. 10 is a top down view of an array of white light LEDs in a backlight where the emission of each LED is modulated based on the image to be displayed by the LCD to achieve a wider dynamic range of brightness across the image.

Elements that are identical or similar are labeled with the same numeral.

DETAILED DESCRIPTION

Figure 2:
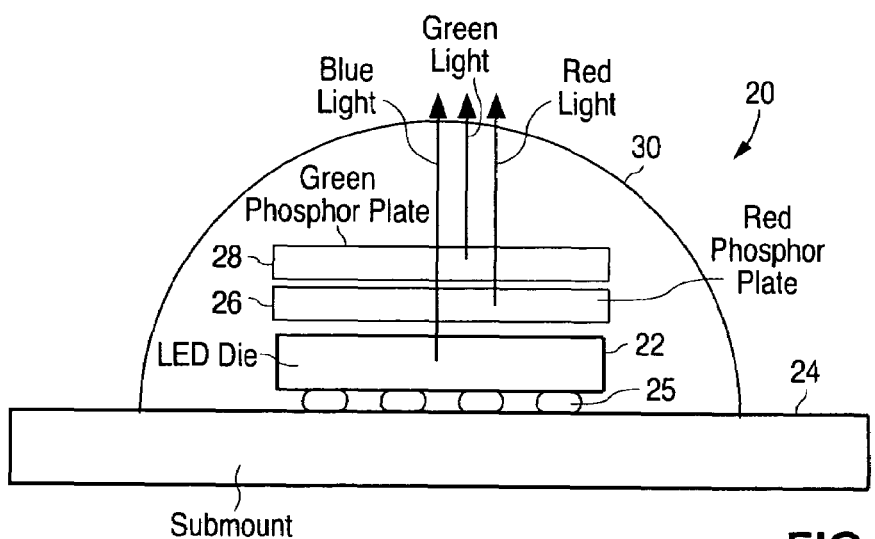
FIG. 2 is a side view of a white light LED, using a blue LED, that may replace each of the LEDs in FIG. 1 in accordance with one embodiment of the invention.

FIG. 2 is a side view of a white light LED 20 formed in accordance with one embodiment of the invention. A conventional blue light LED 22 is soldered to a submount 24 using solder bumps 25 or any other means. The submount 24 has metal contact pads on its surface to which the LED is electrically connected. The contact pads lead to other conductors formed on the periphery or underside of the submount for connection to a power supply such as a current source. The LED 22 may be formed using AlInGaN materials and preferable emits blue light that has a peak wavelength of about 460-470 nm to match the spectral distribution of a conventional blue filter in an LCD. Other emission wavelengths, also considered blue, may also be suitable, such as 440-480 nm. The top surface of the blue LED 22 may be any size, with typical sizes being equal to or less than 1 mm$^2$.

Placed over the LED 22 are a red phosphor plate 26 and a green phosphor plate 28. The size of each plate may match the size of the LED 22 or may be slightly larger or smaller depending on the emission pattern of the LED 22, tolerances, and the characteristics of the phosphor plates. The plates may extend beyond the LED 22 surface by as much as 25%. In one embodiment, the plates are smaller than the LED 22 (e.g., up to 50% smaller) to create a larger blue component in the white light or to allow green and red phosphor plates to be placed side by side. With a thin LED 22, there will be insignificant side emission. Any side emission will be mixed in the backlight box with the white light.

In one embodiment, the thickness of each plate 26 and 28 is between 50-300 microns, depending on the type of phosphor used, the type of blue LED used (e.g., higher power LEDs may need thicker plates), the density of the phosphor, and other factors which would be understood by those in the art.

Figure 3:
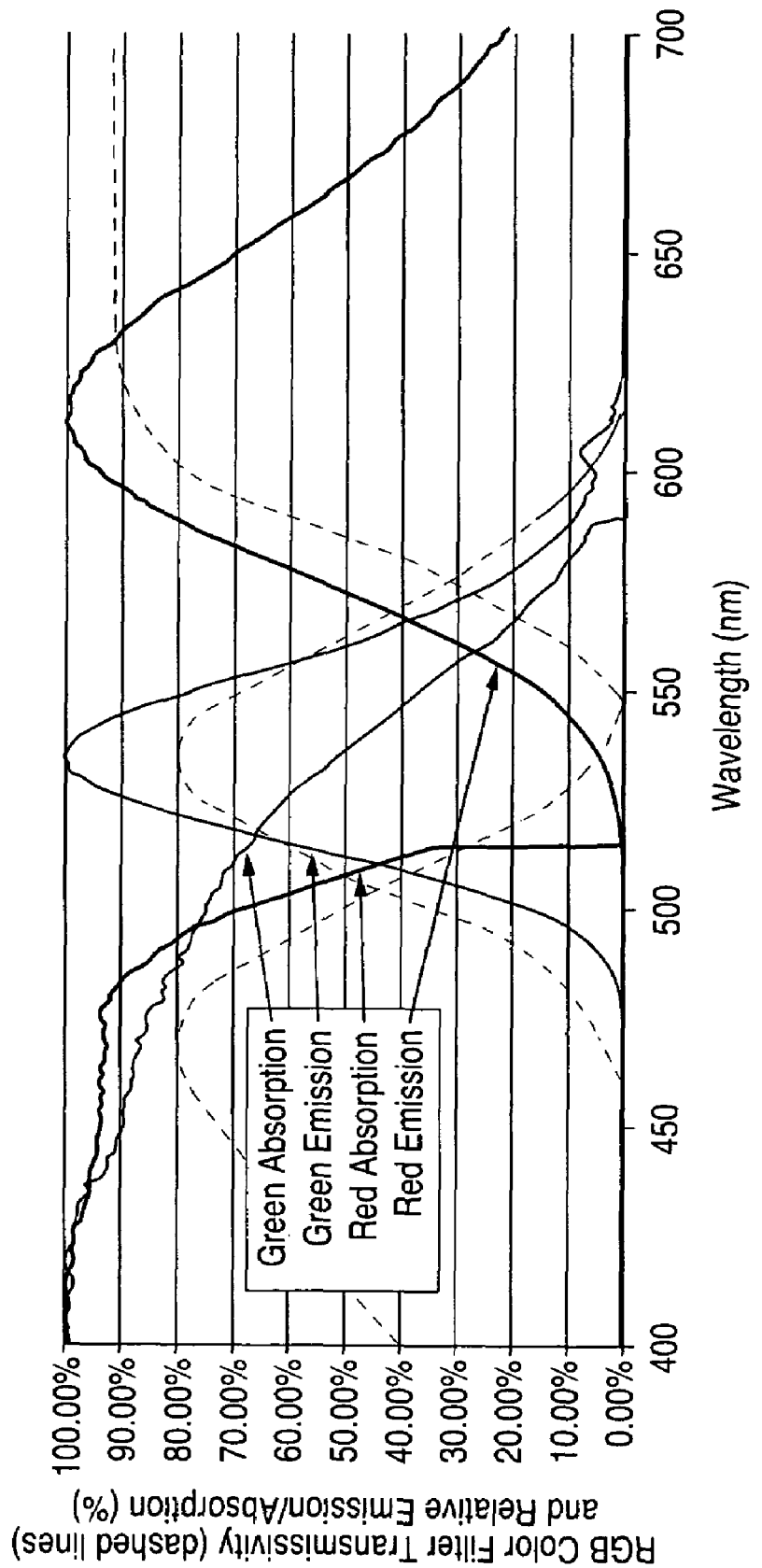
FIG. 3 is a graph of the absorption and emission spectra of suitable red and green phosphors.

It has been found that placing the red phosphor plate 26 beneath the green phosphor plate 28 is advantageous because the red phosphor generally absorbs the green photons, while the green phosphor does not significantly affect the red photons, as seen in the graph of FIG. 3. FIG. 3 illustrates the emission spectra of the red and green phosphors as well as the red absorption by the green phosphor and the green absorption by the red phosphor.

FIG. 3 also illustrates with dashed lines the RGB filter spectral distributions in a typical LCD. The RGB filters in an LCD may have maximum transmissivities (about 80-90%) at approximately 467 nm (blue), 535 nm (green), and 625 nm (red). Typically, the red filter does not have any significant falloff for longer wavelengths and its maximum transmissivity is relatively constant for wavelengths longer than 625 nm. Only the transmissivities of the filters between 425 nm and 660 nm are relevant.

The video signals that are supplied to the LCD are typically standardized so that, for accurate reproduction of the color image, the red, green, and blue pixel video information must correspond to predetermined wavelengths of the red, green, and blue color generated by the LCD. The maximum spectral power density of the red, green, and blue components of the white light emitted by the LED should be approximately matched to the ideal red, green, and blue wavelengths for the LCD. This will faithfully reproduce the original image with the least attenuation by the LCD filters.

Another way of stating the above desired characteristics is that the peak wavelengths of the red, green, and blue light components emitted by the white light LED should approximately match the maximum light output requirements (e.g., maximum transmissivity) of the red, green, and blue subpixels of the LCD (or other pixel modulator type) within the wavelengths of interest. To approximately match the maximum output requirements of the subpixels, the peak wavelengths should be within about 10% of the ideal peak wavelengths or alternatively within a percentage of the ideal peak wavelengths such that the difference is no apparent to a viewer.

In one embodiment, ranges for the maximum spectral densities of the red, green, and blue components emitted by the white light LED are as follows: red between 590 and 660 nm, green between 510 and 570 nm, and blue between 430 and 480 nm. (Light at the lower part of the range of 590-660 nm may be considered red-orange, while light at the higher end of 510-570 nm may be considered yellow-green.) More preferably, the ranges for the maximum spectral densities are: red between 610 and 635 nm, green between 525 and 550 nm, and blue between 450 and 475 nm. A YAG phosphor has a maximum spectral density of about 566 nm.

The plates 26 and 28 may be affixed over the LED 22 and to each other using adhesives or a mechanical holder. Adhesives may include any of the following materials: silicone, low-melting-point glass, transparent adhesives, or other materials. For example, a layer of silicone may be deposited over the LED 22, followed by placement of the red phosphor plate 26, followed by another layer of silicone, followed by the green phosphor plate 28. The structure is then subjected to UV or heat to cure the silicone. Alternatively, small glass beads or a thin glass plate may be provided between the layers, and the structure is then heated to melt the glass. The adhesive should be thin to minimize absorption of light, but the thickness is not critical to the resulting color emission.

The types of phosphors, phosphor grain densities, and thicknesses and size (relative to the top area of the LED) of the plates 26 and 28 are chosen to achieve the desired white point (color temperature) for the LCD and to suitable match the RGB light components to the color filters used by the LCD. Examples of phosphors that have been found suitable in the application include SrSION:Eu, SrBaSiO:Eu, TG, SrSiN:Eu, BaSrSiN:Eu, SrS:Eu, CaS, and YAG.

In one embodiment, a green phosphor plate and a red phosphor plate are placed next to each other in the same plane over the blue LED to create white light. The relative sizes of the plates determine the white point.

In another embodiment, the green phosphor plate 28 in FIG. 2 is replaced by a YAG phosphor plate (adding a yellow-green component) to create white light. The red phosphor plate 26 adds warmth to the white light so that the RGB balance may be adjusted by controlling the characteristics of the YAG and red phosphors. The YAG and red phosphors can be combined in all the ways described herein to generate white light. Further, the YAG phosphor may be conformally deposited over the LED in conventional ways, where the red phosphor plate characteristics are selected based upon the actual YAG characteristics after being deposited on the LED.

A lens 30 may be formed over the resulting structure to achieve a higher extraction out of the phosphors and to optimize the emission pattern. Emission patterns may include a Lambertian pattern, patterns which have good in coupling efficiency into a waveguide, or a pattern that provides a uniform illumination distribution for backlighting an LCD. Lens 30 may be silicone, glass, or other material.

Instead of an adhesive affixing the plates 26 and 28 in place, the lens 30 itself may include a fixture to fix the plates in place. Other mechanical holders may also be used.

Figure 4:
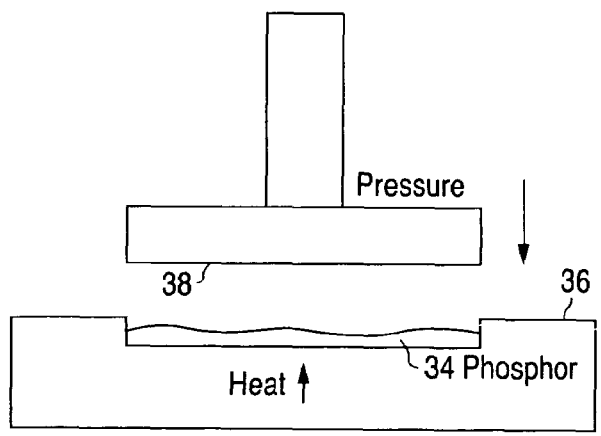
FIG. 4 is schematic of a process for forming a phosphor platelet.

The plates 26 and 28 may be made using the process shown in FIG. 4. In one embodiment, a controlled quantity of phosphor powder 34 is spread out in a mold 36. Pressure is applied by a flat surface 38, such as made of metal or glass, while the phosphor powder 34 is heated, such as by heating mold 34 and/or surface 38 using resistive heating. A transparent binder may also be mixed with the phosphor powder to achieve the desired density of phosphor. The phosphor/binder material is sintered by the heat and pressure. The plates may be 100% ceramic. The resulting plate can be made very smooth on both surfaces, so that the thickness is uniform across the plate. In one embodiment, the uniformity is ±5 microns and preferably ±2 microns.

The mold 34 or surface 38 may include shaping features to affect an emission pattern of the phosphor plate. Such shaping features may be so small that the thickness of the plate across the LED still remains substantially uniform so as to not affect the color uniformity across the LED.

The plate removed from the mold 36 may be a large sheet, and the individual platelets for the each LED may be separated out by sawing or scribing and breaking. Each individual plate will be virtually identical. The thickness and density of the red phosphor plate may be different from the thickness and density of the green phosphor plate in order to achieve the required red and green color components, depending on the materials and other factors. The plates will typically have a substantially rectangular shape.

This process of using preformed phosphor plates, rather than forming the phosphor layers over the LED, results in uniform color conversion across the entire LED, results in identical plates in each LED, and may be simpler than forming phosphor layers over the LED since there is no concern with adversely affecting the LED by the phosphor-forming process.

Figure 5:
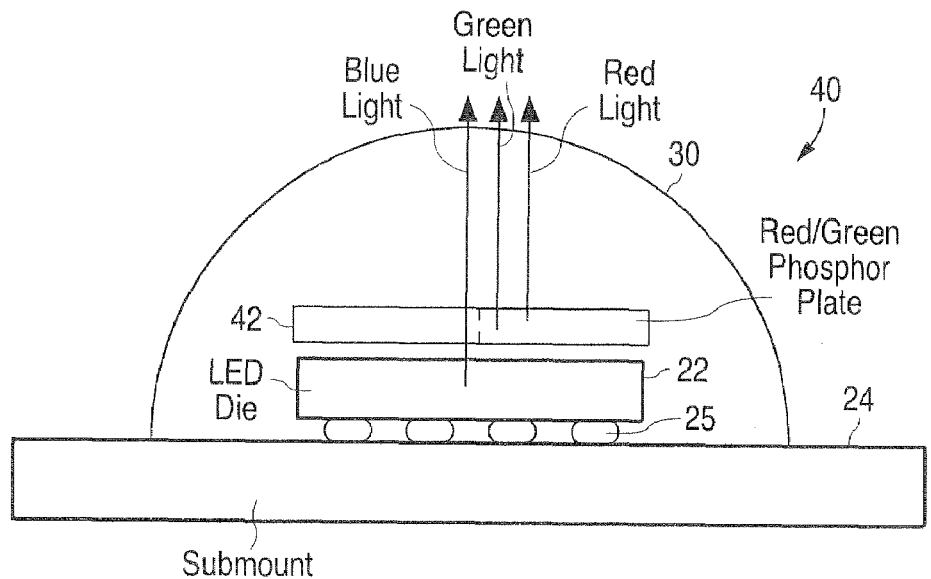
FIG. 5 is a side view of another embodiment of a white light LED, using a blue LED, that may replace each of the LEDs in FIG. 1 in accordance with the invention.

FIG. 5 is a side view of a white light LED 40, where the red and green phosphors are mixed to form a single plate 42. The process for forming plate 42 is the same as that shown in FIG. 4. The relative amounts of the red and green phosphors determine the red and green color components.

A red phosphor plate and a green phosphor plate may be affixed next to each other so as to be coplanar. Such two side-by-side plates are signified by the dashed line bisecting plate 42 in FIG. 5, the red phosphor plate may be on the left side and the green phosphor plate may be on the right side. The relative sizes of the plates may determine the red and green light components.

Figure 6:
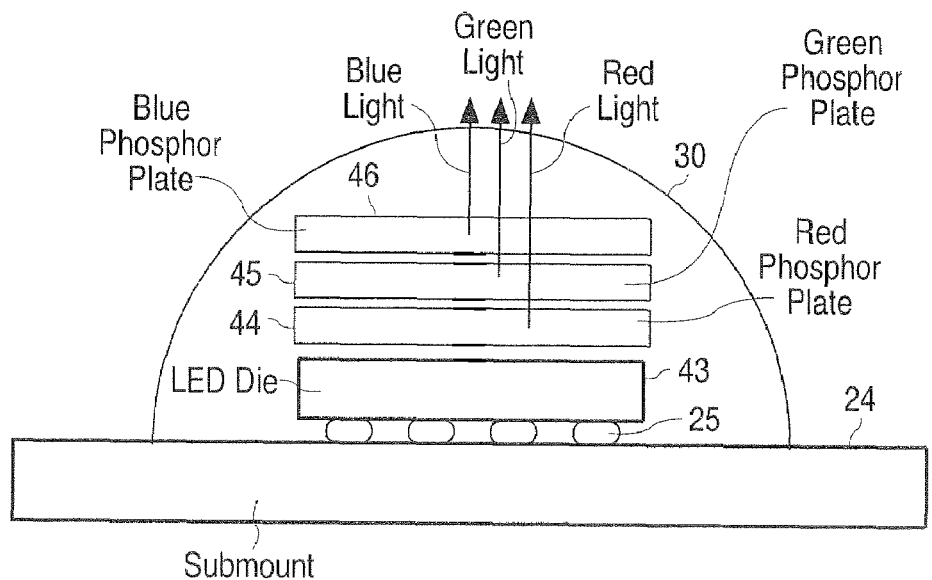
FIG. 6 is a side view of another embodiment of a white light LED, using a UV LED, that may replace each of the LEDs in FIG. 1 in accordance with the invention.

FIG. 6 illustrates the use of a UV LED 43 in a white light LED. The UV LED may have a peak wavelength less than 440 nm. A red phosphor plate 44, a green phosphor plate 45, and a blue phosphor plate 46 are affixed over the UV LED 43 to create white light. The plates may be in a single plane next to each other, or the phosphors may be mixed into a single plate. The plates may be formed using the process of FIG. 4. Any characteristic of the plates may be varies to achieve the desired white point.

Figure 7:
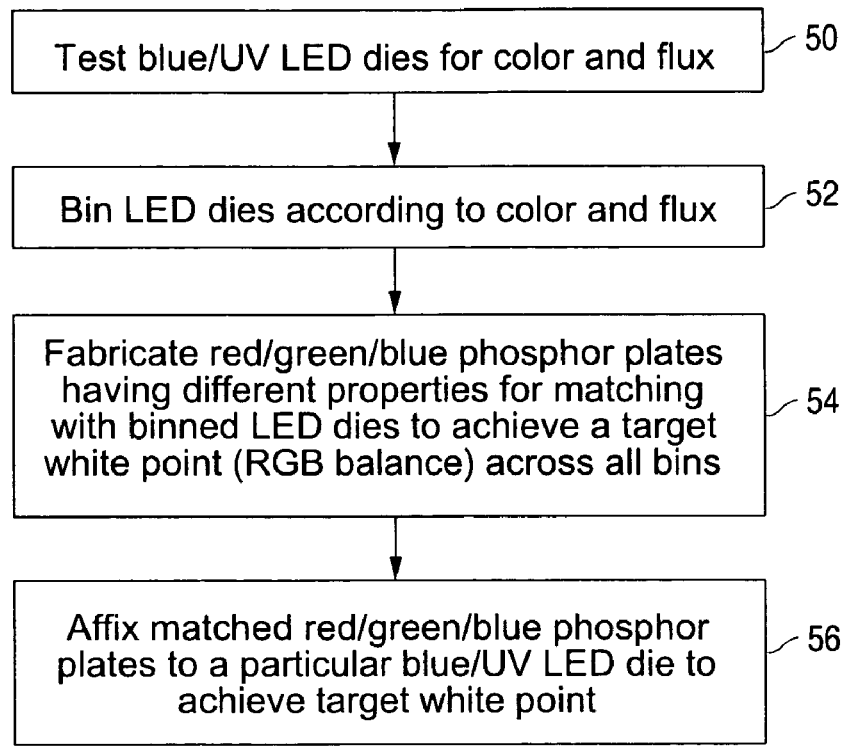
FIG. 7 is a flowchart showing various steps used to match a red, green, or blue platelet to a binned blue or UV LED.

By fabricating the phosphor plates separate from the LED, the phosphor plates may be adjusted to match the characteristics of individual LEDs. Due to fabrication tolerances, the peak wavelength of an LED and the brightness of the LED at a specific driving current varies even when the LEDs are formed using the same steps. FIG. 7 is a flowchart illustrating the basic process of using phosphor plates to achieve a consistent white point despite variations in LEDs.

In step 50 of FIG. 7, the blue or UV LEDs are tested using optical sensors for color and brightness (flux).

In step 52, the LEDs are binned with other LEDs having similar color and brightness. The range of color in a single bin may be 2 nm. The range of brightness in a single bin may be selected so that the difference between the maximum and minimum values in the bin range is barely perceptible to the human eye. In one embodiment, there are five bins for color and, within each color bin, there are five bins for brightness, although the number of bins may be arbitrary.

In step 54, red/green/blue phosphor plates (either separate or mixed) are fabricated having a variety of color conversion and leakage characteristics. Such plates may differ in composition, phosphor density, size, and thickness. The characteristics of the plates are set so that the plates may be matched with LEDs in each bin to produce white light having the same white point.

In step 56, the plates are matched with the corresponding LEDs in the different bins, and affixed to the LEDs.

The resulting white light LEDs each have the same white point. For example, if the peak wavelength of a first blue LED is slightly less than the peak wavelength of a second blue LED, the selected thicknesses, densities, or compositions for the red and green phosphor plates for each LED will produce RGB components in each white light LED to create the same color point. If the first blue LED is brighter than the second blue LED, the white light LED will still produce the same white color point. A brightness feedback may be used to control the light output.

If the white light LEDs are used for an LCD backlight, where the LCD uses RGB filters having a certain spectral distribution, the red/green/blue phosphor plate characteristics are chosen to best match the filter characteristics while obtaining a consistent color point.

Figure 1:
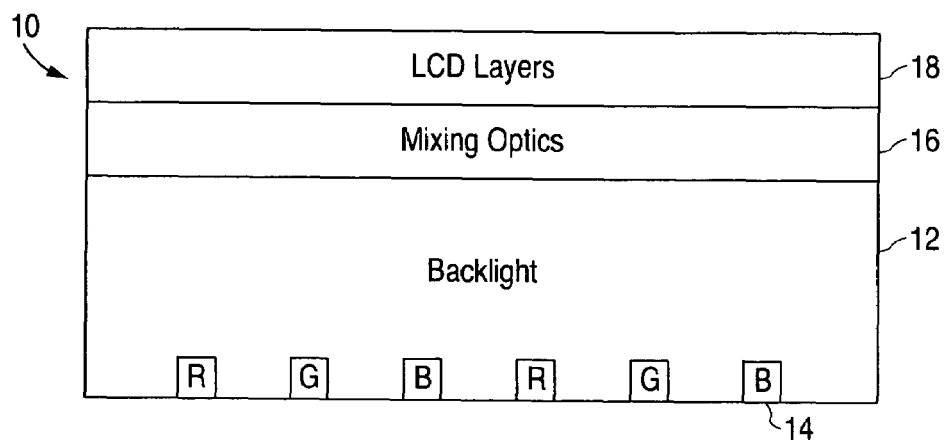
FIG. 1 is a cross-section of a prior art, color, transmissive LCD using separate red, green, and blue LEDs as a white light source.
Figure 8:
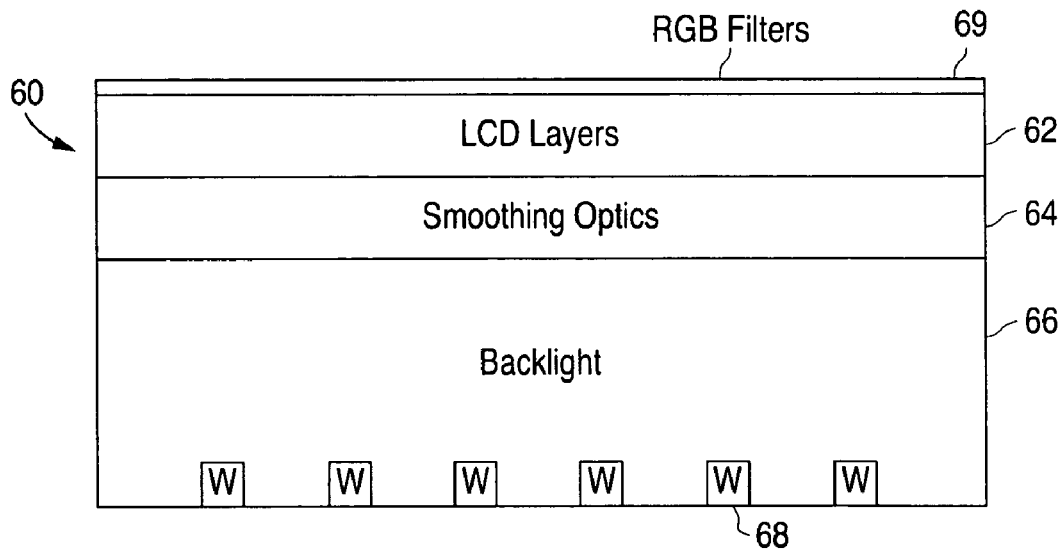
FIG. 8 is a cross-sectional view of an LCD depicting the white light LEDs arranged in a two-dimensional array in a backlight for direct illumination of the LCD layers.

FIG. 8 illustrates an LCD 60 with conventional LCD layers 62 over brightness smoothing optics 64 and a backlight 66 using either of the white light LEDs 68 described above. A backlight is also referred to herein as an illumination module. The top layer of the LCD layers 62 may be RGB filters 69. The white light LEDs 68 are arranged in a two-dimensional array, and the number and pitch of the LEDs are based on the size of the LCD and the types of LEDs used. The smoothing optics 64 are simpler than the mixing optics 16 used in FIG. 1 since there is no need for color mixing, only brightness smoothing. Also, the backlight box may be much shallower than the backlight box in FIG. 1 because there is no need for color mixing. The general backlight technique of FIG. 8 is referred to as direct backlighting. The LCD layers 62 modulate the red, green, and blue subpixel areas on the screen to form a color image.

FIGS. 9A and 9B illustrate a more compact LCD 70 where the white light LEDs 72 described above are arranged in a linear array in a shallow backlight box 74. FIG. 9A is a side view while FIG. 9B is a front view. An angled reflector 76 redirects upward light emitted by the backlight box 74 onto conventional LCD layers 62. The reflector 76 may be a mirror, a diffusing mirror (such as a mirror having a roughened surface), an array of tiny prisms, a plastic waveguide using TIR, a screen printed with a suitable white paint, or any other type of suitable reflector. The LCD layers 62 are shown separated from the backlight for illustration purposes only. An additional mixing layer may be used between the backlight and the LCD layers 62.

The white light LED of the present invention may also be used as an illumination module for a projection display, such as for projecting an image on a remote screen. The projected image is modulated by LC layers. The requirement for approximately matching the wavelengths of the red, green, and blue components of the white light LED to the ideal wavelengths for accurate image reproduction and efficient operation apply equally to illumination modules for backlights and projectors.

The LC layers for displays are also referred to herein as pixelated light modulators, which include modulators in addition to LC layers. The pixelated light modulators may use reflective or transmissive modulation.

FIG. 10 is a top view of a panel of white light LEDs 78 arranged in a two-dimensional array (9×16), forming a backlight for an LCD. The pitch of the LEDs 78 is on the order of 15 mm but, depending on the light output of each LED, the pitch can range from 7 mm to 25 mm. In typical LCDs, the light output of the LEDs in the backlight does not change while the LCD is operating, and the LCD layers completely control the range of brightness of the pixels. In these typical LCDs, some light leaks through the LCD layers even when the image is supposed to be dark.

By modulating the light output of the LEDs 68, by dynamically varying the currents to the LEDs 78, the dynamic range of brightness and contrast at the output of the LCD is increased. This is referred to as spatially modulating the backlight. Philips and Sunnybrook Technologies have researched this modulation technique using light sources other than those described herein. In FIG. 10, the LEDs 78 are modulated by an LED controller 80 based on the image being displayed by the LCD. Each LED 78 illuminates a section of the LCD layers. For images with a dark area, the LEDs 78 behind the dark area would be driven by controller 80 at a lower current than if the image area were a bright area. The circuitry and processing used to convert a video signal into modulating signals for the LED array would be understood by those skilled in the art. For example, one or more frames of the video image would be analyzed to detect dark and light areas, and such detection would be used to modulate the LEDs 78. The signals that control the LCD layers would also be compensated by the modulation of the backlight LEDs 78. Also, by modulating the backlight LEDs 78, there is lower power consumption by the backlight.

LEDs of colors other than red, green, and blue may also be used in the LCD to create white light.

Having described the invention in detail, those skilled in the art will appreciate that given the present disclosure, modifications may be made to the invention without departing from the spirit and inventive concepts described herein. Therefore, it is not intended that the scope of the invention be limited to the specific embodiments illustrated and described.

What is claimed is:

1. A method of forming a light emitting device comprising:
   testing LED dies that emit light with a peak wavelength less than approximately 480 nm and determining light emission characteristics of the LED dies;
   binning the LED dies in accordance with their light emission characteristics;
   forming a variety of plates of a phosphor that emit at least orange-red or red light with a peak wavelength larger than 590 nm when energized by light from the LED dies, the plates being formed separate from the LED dies, the plates having different characteristics associated with different bins of LED dies;
   matching a plate having a particular characteristic to a binned LED die to generate a white light having a target white point;
   affixing a matched plate over an LED die to form a white light LED emitting orange-red or red, green or yellow-green, and blue light components, wherein a combination of the orange-red or red, green or yellow-green, and blue light components produces white light having the target white point; and
   mounting at least one said white light LED in an illumination module for a pixelated light modulator, the modulator controlling at least red, green, and blue color subpixels, wherein the plates are matched to the binned LED dies to generate orange-red or red and blue light components whose peak wavelengths are within approximately 10% of the wavelengths corresponding to maximum light output requirements of the red and blue subpixels within a certain range of wavelengths.

2. A method of forming a light emitting device comprising:
   testing LED dies that emit light with a peak wavelength less than approximately 480 nm and determining light emission characteristics of the LED dies;
   binning the LED dies in accordance with their light emission characteristics;
   forming a variety of plates of a phosphor that emit at least orange-red or red light with a peak wavelength larger than 590 nm when energized by light from the LED dies, the plates being formed separate from the LED dies, the plates having different characteristics associated with different bins of LED dies;

matching a plate having a particular characteristic to a binned LED die to generate a white light having a target white point; and affixing a matched plate over an LED die to form a white light LED emitting orange-red or red, green or yellow-green, and blue light components, wherein a combination of the orange-red or red, green or yellow-green, and blue light components produces white light having the target white point, wherein forming a variety of plates of a phosphor that emit at least orange-red or red light with a peak wavelength larger than 590 nm when energized by light from the LED dies comprises forming a variety of plates of a phosphor that emit at least orange-red or red light and green or yellow-green light when energized by light from the LED dies.

3. The method of claim 2 wherein the LED dies emit blue light.

4. The method of claim 2 wherein the LED dies emit UV light.

5. The method of claim 2 wherein binning the LED dies comprises separating the LED dies based on a peak wavelength output.

6. The method of claim 2 wherein forming a variety of plates of a phosphor that emit at least orange-red or red light when energized by light from the LED dies comprises forming a variety of plates of a phosphor that emit orange-red or red light, green or yellow-green light, and blue light when energized by light from the LED dies.

7. The method of claim 2 wherein forming the variety of plates of a phosphor comprises:

forming a substantially flat first phosphor plate emitting red light; and forming a substantially flat second phosphor plate emitting green light.

8. The method of claim 7 wherein affixing a matched plate over an LED die comprises affixing the second phosphor plate over the first phosphor plate.

9. The method of claim 2 wherein forming the variety of plates of a phosphor that emit at least orange-red or red light comprises mixing green and red emission phosphors together to form a single plate of phosphor.

10. The method of claim 2 wherein the plates have a substantially rectangular prism shape.

11. The method of claim 2 wherein the matched plate has a bottom surface that extends over outer edges of the LED die.

12. The method of claim 2 wherein the matched plate has a bottom surface that does not extend over outer edges of the LED die.

13. The method of claim 2 wherein the matched plate is affixed over the LED die by a mechanical device.

14. The method of claim 2 wherein the target white point is a target white point associated with a bin of LEDs from which the white LED was made.

15. The method of claim 2 wherein the target white point is selected such that a liquid crystal display backlit using the white LED will output a desired color temperature.

16. A method of forming a light emitting device comprising:

testing LED dies that emit light with a peak wavelength less than approximately 480 nm and determining light emission characteristics of the LED dies;

binning the LED dies in accordance with their light emission characteristics;

forming a variety of plates of a phosphor that emit at least orange-red or red light with a peak wavelength larger than 590 nm when energized by light from the LED dies, the plates being formed separate from the LED dies, the plates having different characteristics associated with different bins of LED dies;

matching a plate having a particular characteristic to a binned LED die to generate a white light having a target white point; and affixing a matched plate over an LED die to form a white light LED emitting orange-red or red, green or yellow-green, and blue light components, wherein a combination of the orange-red or red, green or yellow-green, and blue light components produces white light having the target white point, wherein the matched plate is affixed to the LED die by an adhesive, and wherein the adhesive includes one of silicone and glass.

17. A method of forming a light emitting device comprising:

testing LED dies that emit light with a peak wavelength less than approximately 480 nm and determining light emission characteristics of the LED dies;

binning the LED dies in accordance with their light emission characteristics;

forming a variety of plates of a phosphor that emit at least orange-red or red light with a peak wavelength larger than 590 nm when energized by light from the LED dies, the plates being formed separate from the LED dies, the plates having different characteristics associated with different bins of LED dies;

matching a plate having a particular characteristic to a binned LED die to generate a white light having a target white point; and affixing a matched plate over an LED die to form a white light LED emitting orange-red or red, green or yellow-green, and blue light components, wherein a combination of the orange-red or red, green or yellow-green, and blue light components produces white light having the target white point, wherein forming the variety of plates of a phosphor that emit at least orange-red or red light comprises sintering phosphor grains under heat and pressure.

18. A method of forming a light emitting device comprising:

testing LED dies that emit light with a peak wavelength less than approximately 480 nm and determining light emission characteristics of the LED dies;

binning the LED dies in accordance with their light emission characteristics;

forming a variety of plates of a phosphor that emit at least orange-red or red light with a peak wavelength larger than 590 nm when energized by light from the LED dies, the plates being formed separate from the LED dies, the plates having different characteristics associated with different bins of LED dies;

matching a plate having a particular characteristic to a binned LED die to generate a white light having a target white point;

affixing a matched plate over an LED die to form a white light LED emitting orange-red or red, green or yellow-green, and blue light components, wherein a combination of the orange-red or red, green or yellow-green, and blue light components produces white light having the target white point;

providing the white light LED, along with a plurality of other white light LEDs substantially identical to the white light LED, in a backlight for a liquid crystal display (LCD), operating the LCD to create images from red, green, and blue pixels; and modulating a brightness of white light LEDs in the backlight such that a light output of some white light LEDs in the backlight box is different from a light output of other white light LEDs in the backlight.

* * * * *